(12) United States Patent
Brewer

(10) Patent No.: US 11,461,527 B2
(45) Date of Patent: Oct. 4, 2022

(54) INTERFACE FOR DATA COMMUNICATION BETWEEN CHIPLETS OR OTHER INTEGRATED CIRCUITS ON AN INTERPOSER

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 916 days.

(21) Appl. No.: 16/266,033

(22) Filed: Feb. 2, 2019

(65) Prior Publication Data

US 2019/0243700 A1    Aug. 8, 2019

Related U.S. Application Data

(60) Provisional application No. 62/625,520, filed on Feb. 2, 2018.

(51) Int. Cl.
| | |
|---|---|
| *G06F 30/394* | (2020.01) |
| *G11C 7/10* | (2006.01) |
| *G11C 11/409* | (2006.01) |
| *H04L 69/18* | (2022.01) |
| *H04L 69/12* | (2022.01) |
| *H04L 9/40* | (2022.01) |

(52) U.S. Cl.
CPC .......... *G06F 30/394* (2020.01); *G11C 7/1045* (2013.01); *G11C 11/409* (2013.01); *H04L 9/40* (2022.05); *H04L 69/12* (2013.01); *H04L 69/18* (2013.01)

(58) Field of Classification Search
CPC ... G06F 30/394; G11C 7/1045; G11C 11/409; H04L 29/06; H04L 69/12; H04L 69/18
See application file for complete search history.

(56) References Cited

U.S. PATENT DOCUMENTS

2014/0192583 A1\*   7/2014   Rajan ...................... G11C 7/10
                                                                                    365/63

FOREIGN PATENT DOCUMENTS

WO        WO-03090414 A1 \*   10/2003           H04L 49/103

\* cited by examiner

*Primary Examiner* — Duc C Ho

(74) *Attorney, Agent, or Firm* — Nancy R. Gamburd; Gamburd Law Group LLC

(57) ABSTRACT

A representative system, apparatus, method and protocol are disclosed for data communication between chiplets or SOCs on a common interposer. A representative system comprises: an interposer; a first integrated circuit arranged on the interposer, the first integrated circuit comprising a first common protocol interface circuit; a communication link coupled to the first common protocol interface circuit; and a second integrated circuit arranged on the interposer, the second integrated circuit comprising a second common protocol interface circuit coupled to the communication link to form a serial protocol interface between the first common protocol interface circuit and the second common protocol interface circuit. Serial data and control packets and parallel data and control packets having specified, ordered fields are also disclosed.

20 Claims, 12 Drawing Sheets

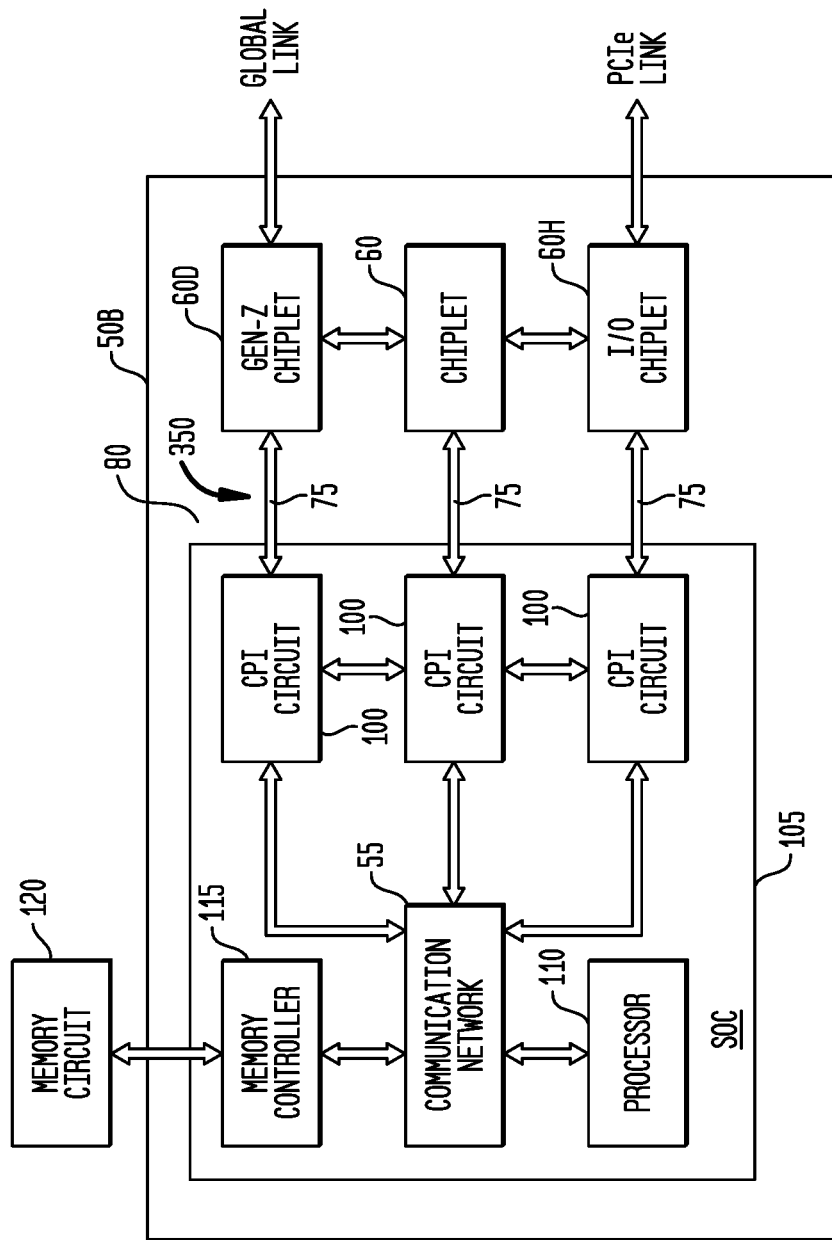

INTERFACE FOR DATA COMMUNICATION BETWEEN CHIPLETS OR OTHER INTEGRATED CIRCUITS ON AN INTERPOSER

CROSS-REFERENCE TO RELATED APPLICATIONS

This application is a nonprovisional of and claims the benefit of and priority to U.S. Provisional Patent Application No. 62/625,520, filed Feb. 2, 2018, inventor Tony M. Brewer, titled "Interface for Data Communication Between Chiplets on an Interposer of a System on a Chip (SOC)", which is commonly assigned herewith, and all of which is hereby incorporated herein by reference in its entirety with the same full force and effect as if set forth in its entirety herein.

STATEMENT REGARDING FEDERALLY SPONSORED RESEARCH OR DEVELOPMENT

This invention was made with government support under Agreement No. HR0011-16-3-0002 awarded by the Department of Defense (DOD-DARPA). The government has certain rights in this invention.

FIELD OF THE INVENTION

The present invention, in general, relates to communication interfaces, and more particularly, relates to an interface apparatus, system, method and protocol for data communication between chiplets or other integrated circuits ("ICs") on an interposer.

BACKGROUND OF THE INVENTION

Silicon devices, with ever decreasing geometries, are reaching the point where only the highest volume devices are economically viable. One possible solution to this challenge is to develop generally usable chips with standard interfaces such that the volume of each individual chip is appropriately high to be economically viable.

Interposers, such as an organic or silicon interposer, have been developed to allow packaging or multiple chiplets (small-scale ICs that embodies a particular function such as data storage, compute, signal processing, etc.) into a single package and to allow the chiplets to communication with each other, including chiplets having a system on a chip ("SOC") (an integrated circuit (or chip) that includes all the components of a computer or other electronic system). New technology is needed for routing signals between one chiplet and another on a common interposer, which has a signal pitch that is much smaller than printed circuit board technology. Interposers can be implanted using silicon, fan-out, or organic substrate material.

To accomplish this, a communication protocol, apparatus, system, and method is needed to provide an interface to be used between silicon integrated circuit ("IC") chips (also referred to as "chiplets") that co-reside on a common interposer. While there are many existing interface standards for various forms of data communication, and new ones currently being defined (e.g., OpenCAPI, CCIX (Cache Coherent Interconnect for Accelerators), Gen-Z), a need remains for a common interface which allows a single silicon die to be partitioned into separate functional die using a common protocol interface ("CPI") with minimal system performance degradation. Described another way, a need remains for a CPI interface to allow a collection of die, potentially from different vendors, to be packaged on a common interposer and function as a single high performance system.

SUMMARY OF THE INVENTION

As discussed in greater detail below, the representative apparatus, system method and protocol for routing signals between one chiplet and another on a common interposer. Representative embodiments provide a common protocol interface ("CPI") circuitry which allows a single silicon die to be partitioned into separate functional die using a CPI circuit with minimal system performance degradation. The representative embodiments provide a CPI circuit 100 which allows a collection of die, potentially from different vendors, to be packaged on a common interposer and function as a single high performance system Representative embodiments further provide for partitioning of a system's communication network across multiple chiplets, including providing low or minimum latency transitioning from one chiplet to another, high or maximum bandwidth per chiplet die edge, a scalable bandwidth to optimally support a wide range of use cases from low bandwidth sensors to high bandwidth compute elements, and a low power physical layer when data is being transferred, and significantly lower power when the interface is idle.

For example, in a representative embodiment, a representative CPI circuit 100 can provide a scalable data rate of 10 Gbps, can have energy efficiency of less than or equal to 1 pJ/bit, a latency less than or equal to 5 ns, and a bandwidth density greater than or equal to 1000 Gbps/mm.

In a representative embodiment, a system comprises: an interposer; a first integrated circuit arranged on the interposer, the first integrated circuit comprising a first common protocol interface circuit; a communication link coupled to the first common protocol interface circuit; and a second integrated circuit arranged on the interposer, the second integrated circuit comprising a second common protocol interface circuit coupled to the communication link to form a serial protocol interface between the first common protocol interface circuit and the second common protocol interface circuit.

In a representative embodiment, the first integrated circuit further comprises: a first processor; a first memory controller; a first communication network coupled to the first common protocol interface circuit, to the first memory controller, and to the first processor; and the second integrated circuit further comprises: a second processor; a second memory controller; a second communication network coupled to the second common protocol interface circuit, to the second memory controller, and to the second processor; wherein the first communication network, the first common protocol interface circuit, the second common protocol interface circuit, and the second communication network collectively define a singular, addressable data and control communication network.

In a representative embodiment, the first common protocol interface circuit comprises: a first parallel flit interface to receive a first parallel data and control packet from the first communication network; a first multiplexer coupled to the first parallel flit interface to convert the first parallel data and control packet to a first serial data and control packet comprising a first plurality of serial flits; a first transmitter coupled to the communication link to sequentially transmit the first plurality of serial flits over the communication link to the second common protocol interface circuit; a first receiver coupled to the communication link to receive a second plurality of serial flits of a second serial data and control packet from the second common protocol interface circuit; and a first demultiplexer coupled to the first parallel flit interface and to the first receiver to convert the second plurality of serial flits to a second parallel data and control packet for transmission on the first communication network.

In a representative embodiment, the second common protocol interface circuit comprises: a second parallel flit interface to receive a third parallel data and control packet from the second communication network; a second multiplexer coupled to the second parallel flit interface to convert the third parallel data and control packet to a third serial data and control packet comprising a third plurality of serial flits; a second transmitter coupled to the communication link to sequentially transmit the third plurality of serial flits over the communication link to the first common protocol interface circuit; a second receiver coupled to the communication link to receive a fourth plurality of serial flits of a fourth serial data and control packet from the first common protocol interface circuit; and a second demultiplexer coupled to the second parallel flit interface and to the second receiver to convert the fourth plurality of serial flits to a fourth parallel data and control packet for transmission on the second communication network.

In a representative embodiment, the first and second parallel data and control packets each comprise a single flit having an ordered plurality of fields, the first and second parallel data and control packets each further comprising:

a packet header comprising: a first field having a plurality of bits specifying a header error correction code; a second field next to the first field and having a plurality of bits specifying a credit return virtual channel; a third field next to the second field and having at least one bit specifying a credit return ready; a fourth field next to the third field and having a plurality of bits specifying a virtual channel; a fifth field next to the fourth field and having at least one bit specifying a link state; a sixth field next to the fifth field and having a plurality of bits specifying a packet length in flits; a seventh field next to the sixth field and having a plurality of bits specifying a destination component identification; and a payload comprising: an eighth field next to the seventh field and having a plurality of bits specifying a payload error correction code; and a ninth field next to the eighth field and having a plurality of bits specifying a data payload.

In a representative embodiment, the first and second serial data and control packets each comprise a respective first or second sequence of a plurality of flits, each flit of the first or second sequence of the plurality of flits having an ordered plurality of fields, the first and second serial data and control packets each further comprising:

a packet header comprising:

a first flit comprising: a first field having a plurality of bits specifying a header error correction code; a second field next to the first field and having a plurality of bits specifying a credit return virtual channel; a third field next to the second field and having at least one bit specifying a credit return ready; a fourth field next to the third field and having a plurality of bits specifying a virtual channel; a fifth field next to the fourth field and having at least one bit specifying a link state; and a second flit following the first flit and comprising: a sixth field having a plurality of bits specifying a packet length in flits; and a seventh field next to the sixth field and having a plurality of bits specifying a destination component identification; and a payload comprising:

a third flit following the second flit and comprising: an eighth field having a plurality of bits specifying a payload error correction code; and a first part of a ninth field next to the eighth field and having a first plurality of bits specifying a data payload;

a fourth flit following the third flit and comprising: a second part of the ninth field having a second plurality of bits specifying the data payload;

a fifth flit following the fourth flit and comprising: a third part of the ninth field having a third plurality of bits specifying the data payload;

a sixth flit following the fifth flit and comprising: a fourth part of the ninth field having a fourth plurality of bits specifying the data payload;

a seventh flit following the sixth flit and comprising: a fifth part of the ninth field having a fifth plurality of bits specifying the data payload; and an eighth flit following the seventh flit and comprising: a sixth part of the ninth field having a sixth plurality of bits specifying the data payload.

In a representative embodiment, the serial protocol interface comprises a plurality of layers, the plurality of layers comprising a first, protocol layer comprising a plurality of packet commands, the plurality of packet commands comprising: a probe; a read8, a read16, or a read 64; a read configuration space; a read response; a write8, a write16, or a write64; a write configuration; a write response; an atomic; and an interrupt.

In a representative embodiment, a read operation comprises a first serial data and control packet transmission having a memory address and a request size, and a second serial data and control packet transmission having the requested memory read data.

In a representative embodiment, a write operation comprises a first serial data and control packet transmission having a memory address, data, a data mask, and a request size, and a second serial data and control packet transmission having a write completion and status.

In a representative embodiment, the serial protocol interface comprises a plurality of layers, the plurality of layers comprising a second, transaction layer comprising endpoint addressing and routing and error correction.

In a representative embodiment, the serial protocol interface comprises a plurality of layers, the plurality of layers comprising a third, link layer implementing a single cycle request and a single cycle response. In a representative embodiment, the link layer is initialized to determine the communication link configuration for both width and frequency or clocking rate, communication link training, and transitioning the communication link to an active state; wherein the link layer uses error correction coding for detection of single and double bit errors and correction of single bit errors; wherein the link layer implements a plurality of virtual channels; and wherein the link layer provides a plurality of credits per virtual channel to enable data to flow.

In a representative embodiment, the communication link may be transitioned between an active state and an inactive state for control of energy consumption.

In a representative embodiment, the serial protocol interface comprises a plurality of layers, the plurality of layers comprising a fourth, physical layer providing a unidirectional receive path and a unidirectional transmission path.

A common protocol interface circuit is also disclosed, comprising: a parallel flit interface to receive a first parallel data and control packet from a communication network; a multiplexer coupled to the parallel flit interface to convert the parallel data and control packet to a serial data and control packet comprising a plurality of serial flits; a transmitter coupled to a communication link to sequentially transmit the first plurality of serial flits over the communication link; a receiver coupled to the communication link to receive a second plurality of serial flits of a second serial data and control packet; and a demultiplexer coupled to the parallel flit interface and to the receiver to convert the second plurality of serial flits to a second parallel data and control packet for transmission on the communication network.

A method of data communication on a communication link coupling a first integrated circuit to a second integrated circuit arranged on an interposer is also disclosed, the method comprising: using a parallel flit interface, receiving a first parallel data and control packet from a communication network; using a multiplexer coupled to the parallel flit interface, converting the first parallel data and control packet to a first serial data and control packet comprising a first plurality of serial flits; using a transmitter coupled to a communication link, sequentially transmitting the first plurality of serial flits over the communication link; using a receiver coupled to the communication link, receiving a second plurality of serial flits of a second serial data and control packet; and using a demultiplexer coupled to the parallel flit interface and to the receiver, converting the second plurality of serial flits to a second parallel data and control packet for transmission on the communication network.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIG. 2 is a block diagram of a representative third computing system embodiment.

DETAILED DESCRIPTION OF REPRESENTATIVE EMBODIMENTS

Figure 1A:
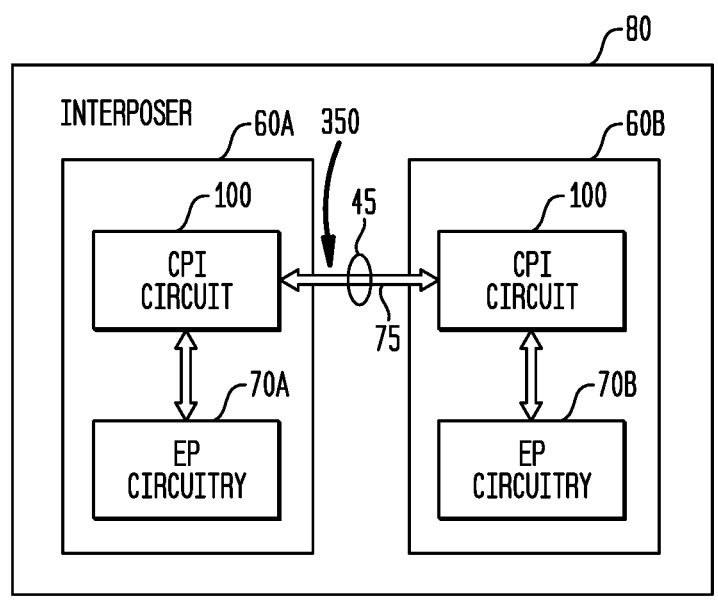
FIGS. 1A and 1B (collectively referred to as FIG. 1), respectively, are block diagrams of representative first and second computing system embodiments.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As discussed in greater detail below, a representative CPI apparatus 100 embodiment, and the various systems 50-50D incorporating the representative CPI apparatus 100 embodiment, include the following important features: separate request and response communication phases; high throughput and low latency operation; support for 8 to 64 byte transfers with a single request/response pair of messages; multiplexed address and data for efficient packing of information within packets; support for multiple outstanding requests/responses from the same requestor; support for out-of-order transaction completion; support for byte-level sub-word writes for efficient non-cached writes to memory; support for interface width and data rate negotiation; support for link activate/deactivate during system operation; support for network endpoint discovery for common system level software; and features to reduce energy consumption.

Figure 1B:
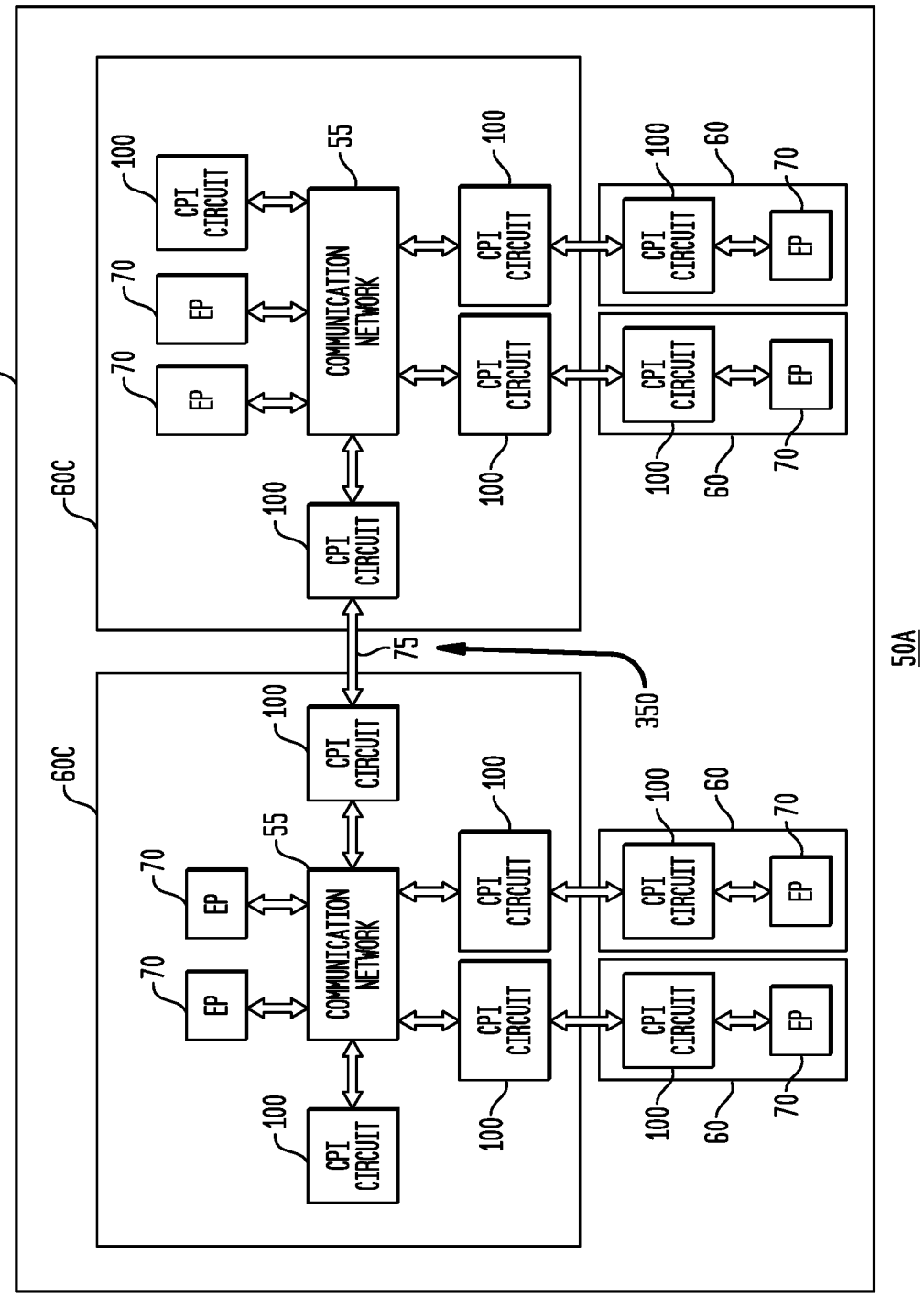
Figure 3:
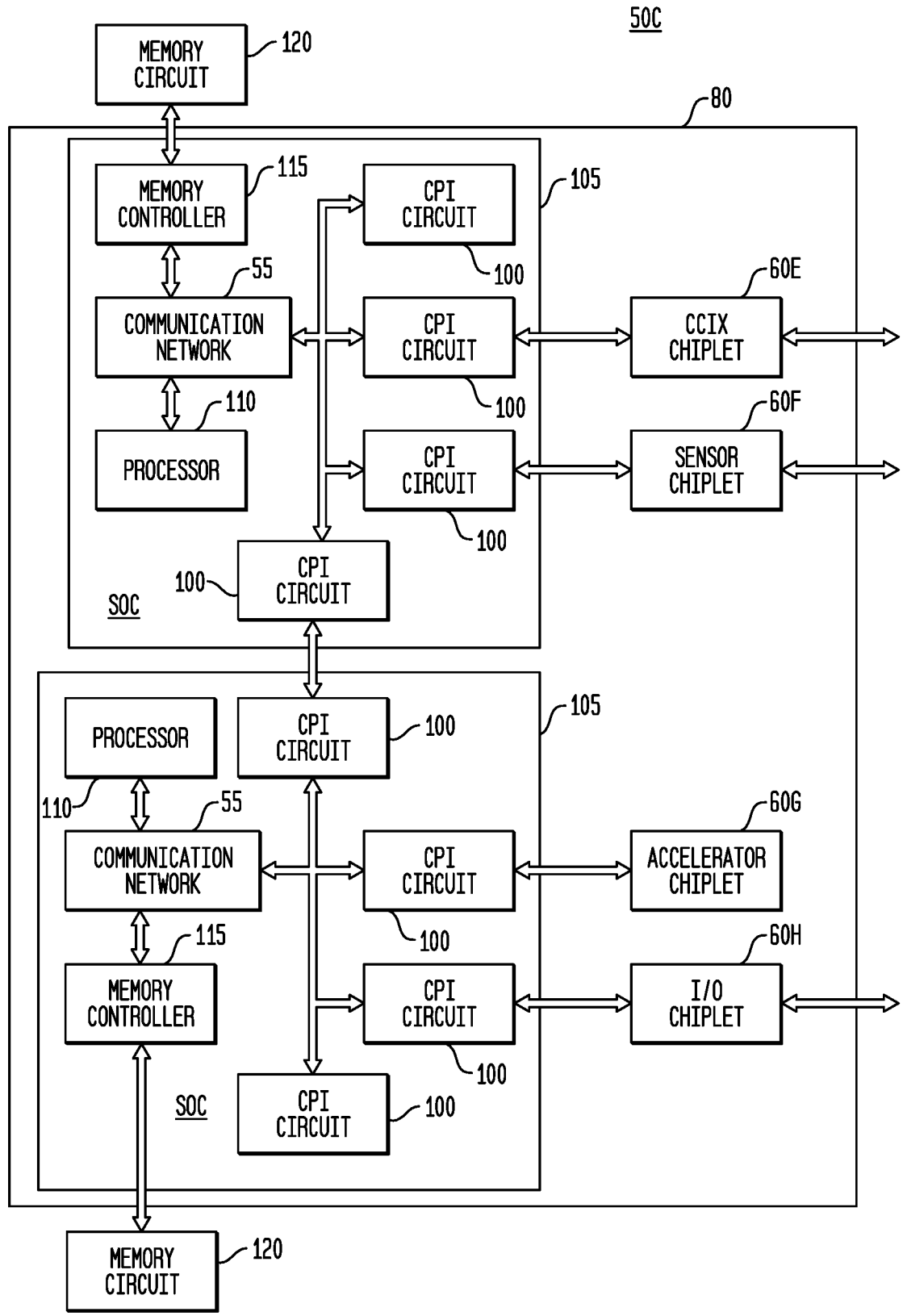
FIG. 3 is a block diagram of a representative fourth computing system embodiment.
Figure 4:
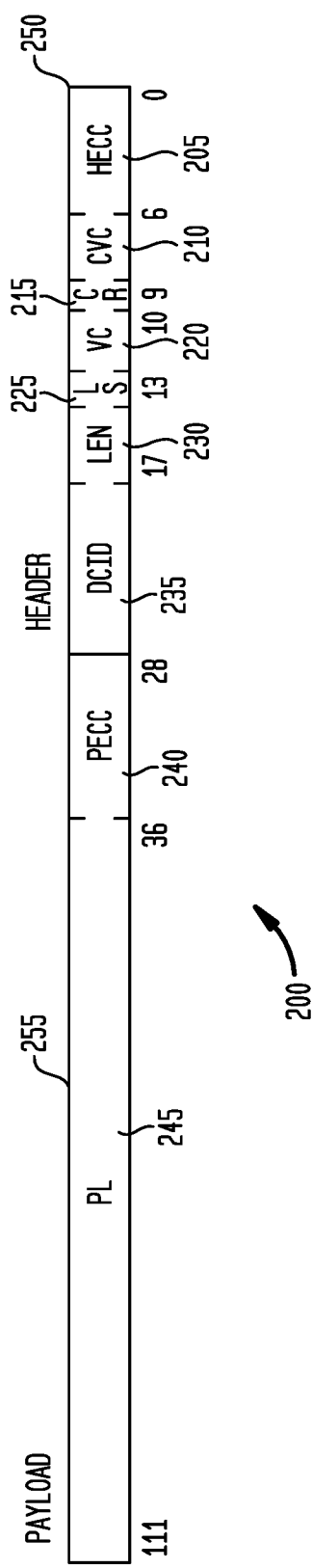
FIG. 4 is a diagram of a representative parallel data and control packet for a representative protocol embodiment.

FIGS. 1A and 1B, respectively, are block diagrams of representative first and second computing system 50, 50A embodiments. FIG. 2 is a block diagram of a representative third computing system 50B embodiment. FIG. 3 is a block diagram of a representative fourth computing system 50C embodiment. FIG. 4 is a block diagram of a representative fifth computing system 50D embodiment.

Referring to FIG. 1A, a representative first computing system 50 embodiment comprises first and second chiplets 60 arranged on an interposer 80, illustrated as chiplets 60A and 60B, with each chiplet 60 comprising a representative common protocol interface ("CPI") circuit 100 (as an apparatus embodiment), and end point ("EP") circuitry 70A, 70B, respectively. Reference to any chiplet 60 shall be understood to mean and include any chiplet 60 such as a chiplet 60A, 60B, or 60C, for example. Similarly, reference to any EP circuitry 70 shall be understood to mean and include any EP circuitry 70 such as a EP circuitry 70A, 70B, or 70C, for example. Each CPI circuit 100 is coupled to each other on the interposer 80 over a communication link 75, which may be implemented as a bus, wires, or other communication lines 45 for data and clock transmission, forming a serial protocol interface 350 between two CPI circuits 100. EP circuitry 70A, 70B may be any type or kind of circuitry. For example and without limitation, the EP circuitry 70A, 70B could be a sensor and processing system that require low bandwidth over the CPI circuit 100, or the EP circuitry 70A, 70B could be a processor and memory that require high bandwidth over the CPI circuit 100.

FIG. 1B shows a more complex topology of chiplets 60 arranged on an interposer 80, in which one or more of the chiplets 60C contain a communication network 55, such as a network-on-chip ("NoC"), a plurality of CPI circuits 100, and a plurality of EP circuitry 70, and with other chiplets 60 each comprising a CPI circuit 100 and EP circuitry 70. The CPI circuits 100 in this case couple the two separate communication networks 55 together and allow the two separate communication networks 55 to act as a single, larger communication network 55 extending to all of the EP circuitry 70 within the interconnected set of chiplets 60 of the system 50A.

Referring to FIG. 1B, a representative second computing system 50A embodiment comprises a plurality of chiplets 60 arranged on an interposer 80, with each chiplet 60 comprising a representative CPI circuit 100 and EP circuitry 70. Each CPI circuit 100 is coupled to at least one other CPI circuit 100 on the interposer 80 over a communication link 75, which also may be implemented as a bus, wires, or other communication lines. The illustrated EP circuitry 70 also may be any type or kind of circuitry. For example and without limitation, the EP circuitry 70 could be a sensor, a processor, a memory, a memory controller, configurable computation circuitry, etc.

Referring to FIG. 2, a representative third computing system 50B embodiment comprises a larger, SOC IC 105 and a plurality of chiplets 60 arranged on an interposer (or substrate) 80. For this example, SOC IC 105 also includes a communication network 55 coupled to a plurality of processors 110 and a memory controller 115 (coupled to a memory 120), and the plurality of chiplets 60 include a Gen-Z chiplet 60D and other input-output ("I/O") circuit chiplet 60H, which are coupled to the SOC IC 105 via a plurality of CPI circuits 100. The third computing system 50B embodiment allows multiple chips (CCIX, Gen-Z, OpenCAPI, etc.) to communicate with a system level interconnect (such as the communication network 55) using a load/store model.

Referring to FIG. 3, fourth computing system 50C embodiment comprises a plurality of SOC ICs 105 arranged on an interposer 80. A second use for a CPI circuit 100 is to connect 2 SoCs together to form a more powerful complex. In the example system 50C, CPI circuits 100 are used to connect multiple SOCs 105 on an interposer 80 in the same package. CPI circuits 100 are also shown connected to a CCIX interface chiplet 60E, a sensor chiplet 60F, an accelerator chiplet 60G, and a PCIe interface chiplet 60H.

The CPI circuit 100 is described, for example, as if it were connected to an AXI interface within a chiplet design. CPI circuits 100 may be implemented alternatively as well, such as embodiments that does not use AXI.

CPI circuits 100 implement a packet-based protocol optimized to support memory-semantic communications between two components in the same package. Possible component types include processors, memory, byte-addressable storage, I/O, FPGA, GPGPU, DSP, etc. Only point-to-point communication is supported in representative embodiments.

Figure 5:
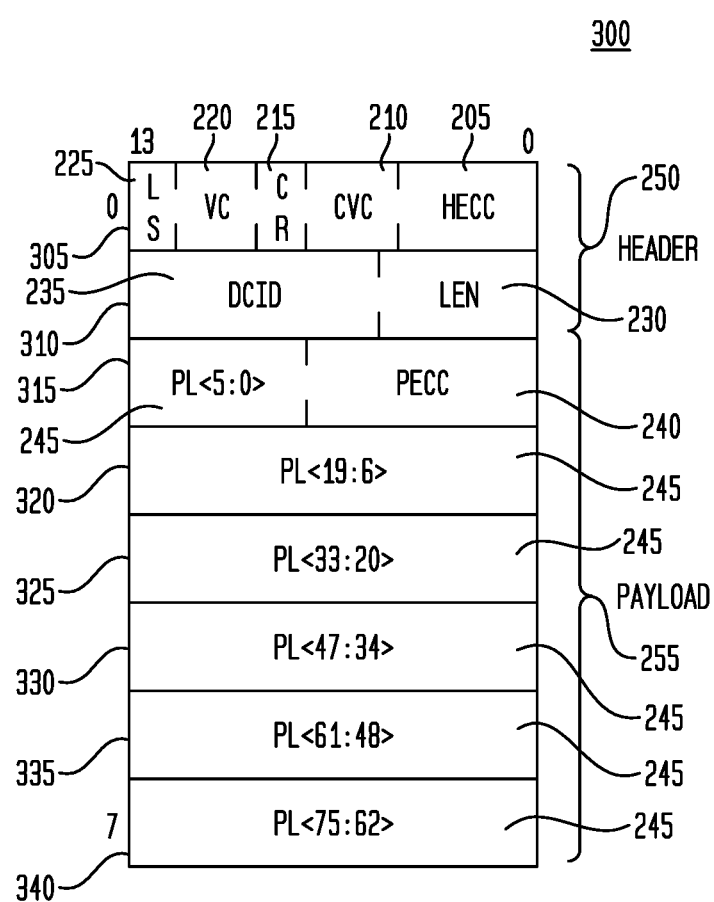
FIG. 5 is a diagram of representative serial data and control packets for a representative protocol embodiment.

The CPI circuit 100 transfers information in units of flits (flow control units or flow control digits), with a packet size ranging from one to multiple flits. Internal to the SOC IC 105, a flit may be transferred in a single clock for a high performance interface, or in multiple clocks for lower performance implementations. FIG. 4 is a diagram of a representative parallel data and control packet 200 for a representative protocol embodiment, which may be transferred in parallel in a single clock cycle, for example. FIG. 5 is a diagram of representative serial data and control packet 300 for a representative protocol embodiment. Table 1 provides a description of the fields utilized in the parallel data and control packet 200 and in the serial data and control packets 300. As discussed in greater detail below, a serial data and control packet 300 can be constructed from parallel data and control packet 200 and vice-versa using demultiplexers and multiplexers, for example and without limitation.

TABLE 1

| Field Name | Field Width (in bits) | Field Description |
|---|---|---|
| HECC | 6 | Header ECC |
| CVC | 3 | Credit return Virtual Channel |
| CR | 1 | Credit Return ready |
| VC | 3 | Virtual Channel designation |
| LS | 1 | Link State |
| LEN | 4 | Packet length in flits |
| DCID | 10 | Destination Component Identifier (ID), e.g., an identifier for a fabric EP circuitry 70 |
| PECC | 8 | Payload ECC |
| PL | 76 | Payload |

Referring to FIG. 4, the parallel data and control packet 200 comprises 112 bits, as a single flit, arranged in order as a packet header 250 having 28 bits and a payload 255 having 84 bits, each of which in turn are arranged as an ordered set of fields, comprising (in order):

(1) a packet header 250 comprising seven fields arranged as a first, header error correction ("HECC") field 205 (6 bits in bit positions 0 to 5); next, a second, credit return virtual channel ("CVC") field 210 (3 bits in bit positions 6 to 8); next, a third, credit return ready ("CR") field 215 (1 bit in bit position 9); next, a fourth, virtual channel designation ("VC") field 220 (3 bits in bit positions 10 to 12); next, a fifth, link state ("LS") field 225 (1 bit in bit position 13) used by the link layer; next, a sixth, packet length in flits ("LEN") field 230 (4 bits in bit positions 14 to 17); and next, a seventh, destination component identifier (ID) ("DCID") field 235 (10 bits in bit positions 14 to 17); and (2) a payload 255 comprising two fields arranged as an eighth, payload error correction ("PECC") field 240 (8 bits in bit positions 28 to 35); and a ninth, data payload ("PL") field 245 (76 bits in bit positions 36 to 111).

Referring to FIG. 5, the serial data and control packet 300 also comprises 112 bits, as an ordered series of eight sequential flits, also arranged in order as a packet header 250 having 28 bits and a payload 255 having 84 bits, each of which in turn are also arranged as an ordered set of fields in different sequential flits, comprising (in order):

(A) a packet header 250 comprising seven fields arranged in the first two flits 305, 310 as:

(1) in a first flit 305 as a first, header error correction ("HECC") field 205 (6 bits in bit positions 0 to 5); next, a second, credit return virtual channel ("CVC") field 210 (3 bits in bit positions 6 to 8); next, a third, credit return ready ("CR") field 215 (1 bit in bit position 9); next, a fourth, virtual channel designation ("VC") field 220 (3 bits in bit positions 10 to 12); and next, a fifth, link state ("LS") field 225 (1 bit in bit position 13) used by the link layer;

(2) next, in a second flit 310, a sixth, packet length in flits ("LEN") field 230 (4 bits in bit positions 0 to 3); and next, a seventh, destination component identifier (ID) ("DCID") field 235 (10 bits in bit positions 4 to 13); and (B) a payload 255 comprising two fields arranged in the third through eighth flits 315, 320, 325, 330, 335, and 340 (six flits), as:

(1) in a third flit 315, an eighth, payload error correction ("PECC") field 240 (8 bits in bit positions 0 to 7); and a first part of the ninth, data payload ("PL") field 245 (initial 6 bits <5:0> in bit positions 8 to 13);

(2) in a fourth flit 320, a second part of the ninth, data payload ("PL") field 245 (the next 14 bits <19:6> in bit positions 0 to 13);

(3) in a fifth flit 325, a third part of the ninth, data payload ("PL") field 245 (the next 14 bits <33:20> in bit positions 0 to 13);

(4) in a sixth flit 330, a fourth part of the ninth, data payload ("PL") field 245 (the next 14 bits <47:34> in bit positions 0 to 13);

(5) in a seventh flit 335, a fifth part of the ninth, data payload ("PL") field 245 (the next 14 bits <61:48> in bit positions 0 to 13); and (6) in an eighth and last flit 340, a sixth and last part of the ninth, data payload ("PL") field 245 (the next 14 bits <75:62> in bit positions 0 to 13).

It should be noted that both the parallel data and control packet 200 and the serial data and control packet 300 each include two different error correction fields, a separate header error correction field 205 and a separate data payload error correction field 240, rather than a single, overall packet error correction field. Each of these error correction fields 205, 240 may be utilized separately, such as using the header error correction field 205 during packet routing, and using the data payload error correction field 240 to correct data payload errors at the packet destination.

Figure 6:
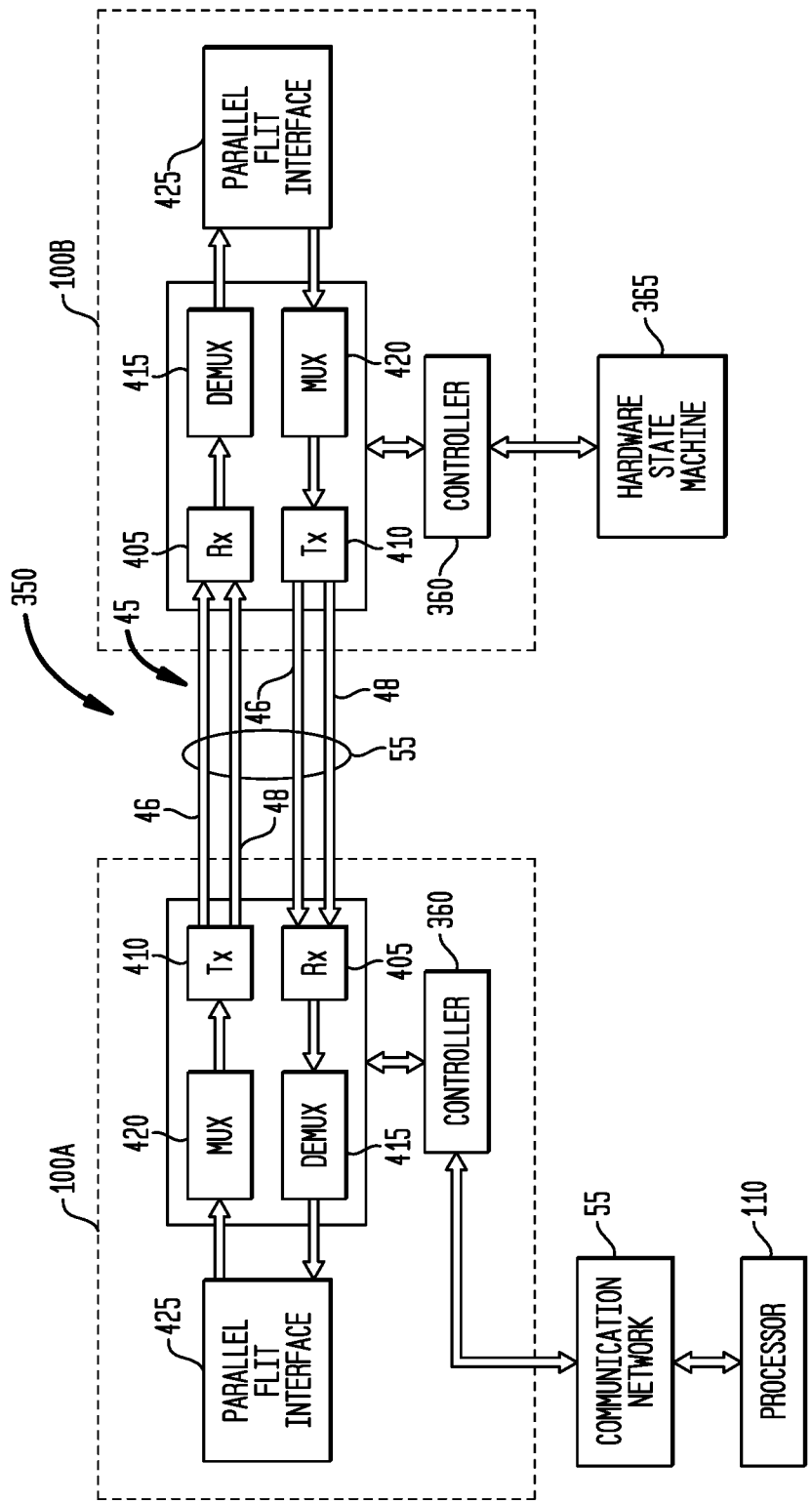
FIG. 6 is a block diagram of a representative CPI circuit apparatus embodiment.

The CPI circuit 100 converts between an internal, parallel flit format (parallel data and control packet 200) and an external, serialized flit format (serial data and control packets 300), typically at two flits per nanosecond, and then transferring data across the communication link 75 as serial flits, each as 14-bit words, at 16 GT/s. FIG. 6 is a block diagram of a representative CPI circuit 100 embodiment, showing a first CPI circuit 100A coupled via bus or other communication lines 45 to create a communication link 75 to a second CPI circuit 100B as an interconnected pair of CPI circuits 100, with the communication between them defined or implemented as a serial protocol interface 350. Each CPI circuit 100 comprises a parallel flit interface 425, a controller 360, a receiver 405 coupled to a demultiplexer 415, and a transmitter 410 coupled to a multiplexer 420, for bidirectional communication over the communication link 75. The parallel flit interface 425 (which may be implemented, for example, as one or more registers to store or hold a parallel data and control packet 200) is utilized for communication in parallel over a communication network 55, and the controller 360 is adapted to perform activities such as communication link 75 negotiation and activation (as discussed in greater detail below), as illustrated. The controller 360 may also be coupled to communicate with other system 50, 50A, 50B, 50C components, such as the illustrated processor 110 and hardware state machine 365. A representative circuit implementation of a CPI circuit 100 is illustrated and discussed in greater detail below with reference to FIG. 12.

The parallel data and control packet 200 is typically transmitted as a single flit to the parallel flit interface 425 of a CPI circuit 100 from another component in the same IC, such as to parallel flit interface 425 of a first CPI circuit 100 over a first communication network 55 from a first processor 110 in a first SOC 105. From the parallel data and control packet 200, the first CPI circuit 100 generates (using multiplexer 420) and sequentially transmits (using transmitter 410, as physical layer signaling), in order, each flit of the serial data and control packets 300, over a communication link 75 to be received by a receiver 405 of a second CPI circuit 100, which is typically part of another chiplet, such as a second SOC 105. Using each flit 315, 320, 325, 330, 335, and 340 in order from the received serial data and control packets 300, the second CPI circuit 100 generates (using demultiplexer 415) and transmits (using a parallel flit interface 425) a single flit comprising the parallel data and control packet 200, such as over a second communication network 55 to a second processor 110 in the second SOC 105.

Communication systems are often described in terms of functionality provided per layer. Each layer may be separate from the other layers such that each layer has its own dedicated resources. However, resources are often shared between layers to minimize hardware resources or for other reasons, such as to improve the efficiency of the interface.

The CPI circuit 100 is a key component of an extended network across multiple chiplets. The chiplet network is implemented completely in hardware (as opposed to networking stacks where the higher levels are implemented in software). As such, tradeoffs for the networking layers have been made to minimize hardware resources and maximize link efficiency. Specifically, the fields of the flit format have been optimized to minimize the width of a flit of serial data and control packet 300. As an example, typically the multiple network layers each have size information. The protocol used by the serial data and control packet 300 and the parallel data and control packet 200 used with the CPI circuit 100 have a single length field 230 that is used by all network layers to provide the size information.

The following sections present the functionality of the communication protocol implemented by the CPI circuit 100, organized by networking layer.

The protocol layer defines the use of multiple packets to perform higher level operations. This communication protocol implemented by the CPI circuit 100 is modeled as non-coherent memory read and write operations. These operations were chosen due to their impact on overall system performance. Table 2 provides an initial list of commands which can be used in a parallel data and control packet 200 and a serial data and control packet 300, for example and without limitation. Other commands may be specified by individual vendors, also for example and without limitation.

TABLE 2

| Name | Description | Virtual Channel | Notes |
|---|---|---|---|
| Nop | No operation (idle) | N/A | |
| Probe | Determine if endpoint is present | Request | Used during initial OS boot to discover system capabilities. |
| Read8, Read16, Read64 | Read the current value in the media. | Request | Intended for CSR and memory space. 8B, 16B or 64B |
| ReadCfg | Read the current value in configuration space. | Request | 8B |
| ReadRsp | Response with data for software coherent memory regions. | Response | Data is scheduled on the data bus in the same order as the response. |
| Write8, Write16, Write64 | Write the data into the memory media | Request | Intended for CSR and memory spaces, 8B, 16B or 64B |
| WriteCfg | Write the data in configuration space. | Request | 8B |
| WriteRsp | Response without data | Response | Used for responses to requests that do not require data, like write. |
| Atomics | Atomic memory operators | Request | Used to perform atomic memory operators |
| Interrupt | Used to initiate interrupt service at a target processor | Request | An interrupt vector is included in the data field. |

Figure 7:
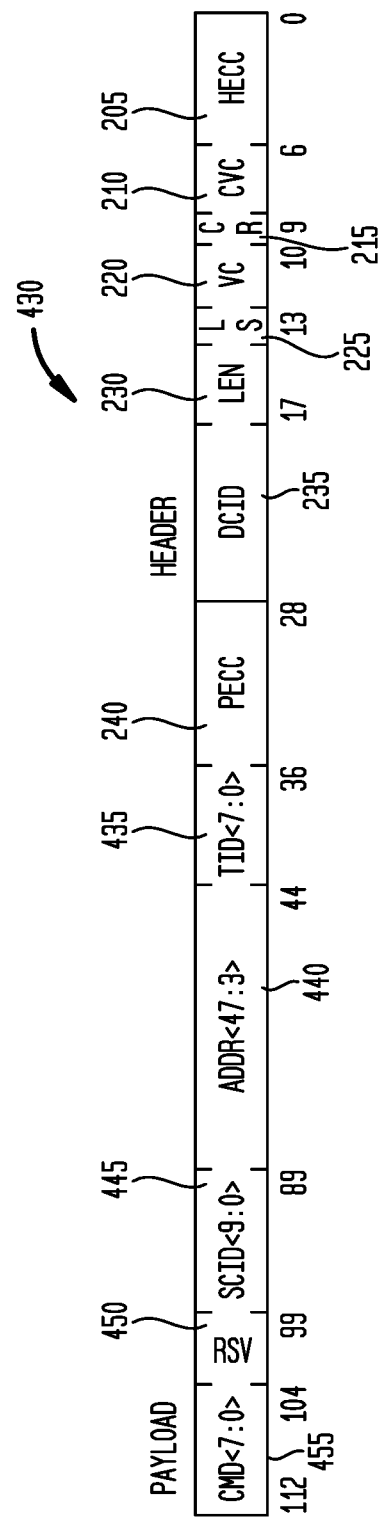
FIG. 7 is a diagram of a representative read request packet for a representative protocol embodiment.

A non-coherent read operation consists of two packets being sent across the fabric. The first is a read request packet 430 that provides the memory address and request size. The second is the read response packet 460 that returns the requested memory read data back to the requestor. FIG. 7 is a diagram of a representative read request packet 430 (shown in parallel format of a parallel data and control packet 200) for a representative protocol embodiment, and shows the flit payload for a read8 request packet. As described above, the parallel format of a parallel data and control packet 200 may be converted to the serial format of a serial data and control packet 300. Table 3 provides a description of each field of a read request packet 430, illustrated for a Read8 request packet.

TABLE 3

| Field Name (and Reference number in the Figures) | Field Width | Field Description |
|---|---|---|
| HECC (205) | 6 | Header ECC |
| CVC (210) | 3 | Credit return virtual channel |
| CR (215) | 1 | Credit return ready |
| VC (220) | 3 | Virtual channel - virtual channel for read request packet |
| LS (225) | 1 | Link state - used by link layer |
| LEN (230) | 4 | Packet length in flits - read request packet is a single flit |
| DCID (235) | 10 | Destination Component ID - identifier for a fabric EP circuitry 70 for request packet |
| PECC (240) | 8 | Payload ECC |
| TID (435) | 8 | Transaction ID - used by requestor to pair request with response |
| ADDR (440) | 45 | Address - bits 47:3, bits 2:0 are implicitly zero |
| SCID (445) | 10 | Source Component ID - identifier for a fabric EP circuitry 70 for read response |
| RSV (450) | 5 | Reserved |
| CMD (455) | 8 | Read Command Type - Read Request, includes size of request |

Figure 8:
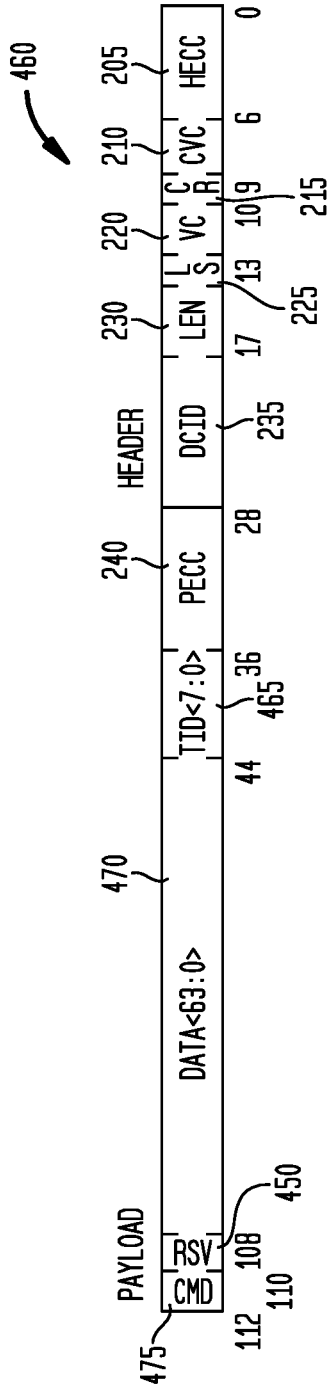
FIG. 8 is a diagram of a representative read response packet for a representative protocol embodiment.

FIG. 8 is a diagram of a representative read response packet 460 (shown in parallel format of a parallel data and control packet 200) for a representative protocol embodiment. As described above, the parallel format of a parallel data and control packet 200 may be converted to the serial format of a serial data and control packet 300. A memory controller 115 will receive the read request packet 430, process the request, and respond with a read response packet 460. Table 4 provides a description of each field of a read response packet 460, illustrated for a Read8 response packet.

TABLE 4

| Field Name (and Reference number in the Figures) | Field Width | Field Description |
|---|---|---|
| HECC (205) | 6 | Header ECC |
| CVC (210) | 3 | Credit return virtual channel |
| CR (215) | 1 | Credit return ready |
| VC (220) | 3 | Virtual channel - virtual channel for read request packet |
| LS (225) | 1 | Link state - used by link layer |
| LEN (230) | 4 | Packet length in flits - read request packet is a single flit |
| DCID (235) | 10 | Destination Component ID - identifier for a fabric EP circuitry 70 for request packet |
| PECC (240) | 8 | Payload ECC |
| TID (465) | 8 | Transaction ID - used by requestor to pair request with response |
| DATA (470) | 64 | Read Response Data |
| RSV (450) | 2 | Reserved |
| CMD (475) | 2 | Packet Command Type - Type of response, 2 is normal, 3 is error |

Figure 9:
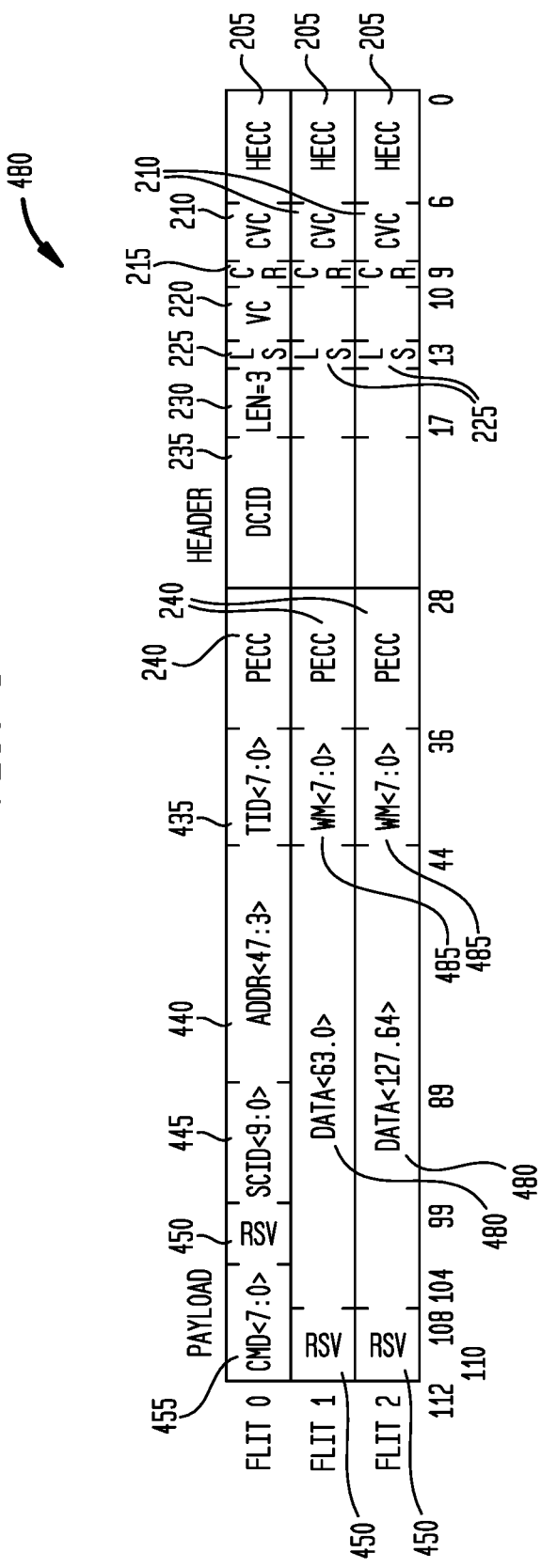
FIG. 9 is a diagram of representative write request packets for a representative protocol embodiment.

A non-coherent write operation consists of two packets being sent across the fabric. The first is a write request packet 480 that provides the memory address (field 440), data (fields 490), data mask (field 485) and request size. The second is the write response packet 495 that returns the write completion and status to the requestor. FIG. 9 is a diagram of representative write request packets 480 for a representative protocol embodiment, illustrating a Write16 Request Packet Format (shown as multiple flits in parallel format of a parallel data and control packet 200) and shows the flit payload for a Write16 request packet. As described above, the parallel format of a parallel data and control packet 200 may be converted to the serial format of a serial data and control packet 300. Table 5 provides a description of each field of a write request packet 480, illustrated for a Write16 request packet.

TABLE 5

| Field Name (and Reference number in the Figures) | Field Width | Field Description |
|---|---|---|
| HECC (205) | 6 | Header ECC |
| CVC (210) | 3 | Credit return virtual channel |
| CR (215) | 1 | Credit return ready |
| VC (220) | 3 | Virtual channel - virtual channel for read request packet |
| LS (225) | 1 | Link state - used by link layer |
| LEN (230) | 4 | Packet length in flits - write16 request packet is three flits, only valid in flit 0 of a packet |
| DCID (235) | 10 | Destination Component ID - identifier for a fabric EP circuitry 70 for request packet, only valid in flit 0 of a packet |
| PECC (240) | 8 | Payload ECC |
| TID (435) | 8 | Transaction ID - used by requestor to pair request with response |

TABLE 5-continued

| Field Name (and Reference number in the Figures) | Field Width | Field Description |
|---|---|---|
| ADDR (440) | 45 | Address - bits 47:3, bits 2:0 are implicitly zero |
| SCID (445) | 10 | Source Component ID - identifier for a fabric EP circuitry 70 for write response |
| RSV (450) | 5 | Reserved |
| CMD (455) | 8 | Command Type - Write16 Request |
| WM (485) | 8 | Write Mask - byte write mask allowing sub word writes at memory, mask applies to 8-byte data in same flit |
| DATA (490) | 64 | Write Data - 8 bytes per flit |

Figure 10:
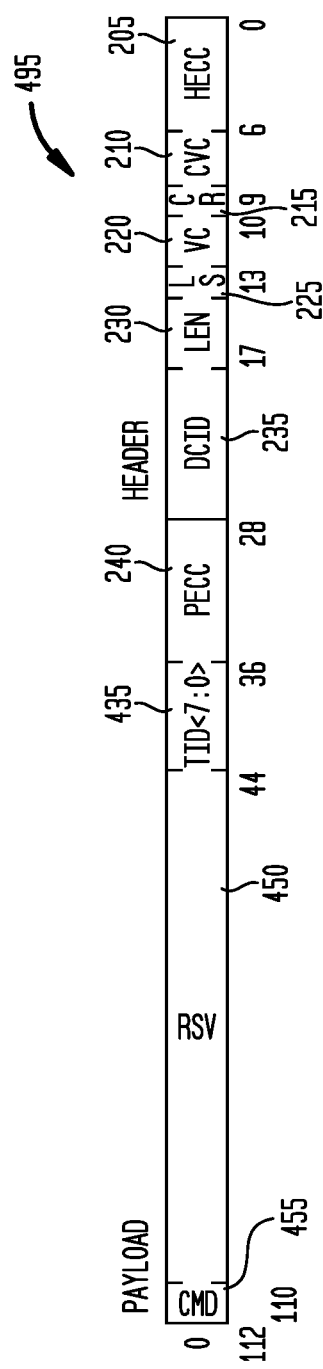
FIG. 10 is a diagram of a representative write response packet for a representative protocol embodiment.

A fabric EP circuitry 70 will receive the write16 request packet, process the request and respond with a write completion (response) packet 495. FIG. 10 is a diagram of a representative write response packet 495 for a representative protocol embodiment, and shows the format for the write response packet 495. Table 6 provides a description of each field of a write response packet 495.

TABLE 6

| Field Name (and Reference number in the Figures) | Field Width | Field Description |
|---|---|---|
| HECC (205) | 6 | Header ECC |
| CVC (210) | 3 | Credit return virtual channel (see section Error! Reference source not found.) |
| CR (215) | 1 | Credit return ready (see section Error! Reference source not found.) |
| VC (220) | 3 | Virtual channel - virtual channel for read request packet |
| LS (225) | 1 | Link state - used by link layer (see section Error! Reference source not found.) |
| LEN (230) | 4 | Packet length in flits - read request packet is a single flit |
| DCID (235) | 10 | Destination Component ID - identifier for a fabric EP circuitry 70 for request packet |
| PECC (240) | 8 | Payload ECC |
| TID (435) | 8 | Transaction ID - used by requestor to pair request with response |
| RSV (450) | 66 | Reserved |
| CMD (455) | 2 | Packet Command Type - Type of response, 2 is normal, 3 is error |

The transaction layer defines the mechanisms to allow network endpoint-to-endpoint reliable communication. The transaction layer mechanisms are described in greater detail below.

The header 250 of a parallel data and control packet 200 and a serial data and control packet 300 contains a 10-bit field named "DCID" (field 235) that is used to specify the destination of the EP circuitry 70 for routing a packet to that destination. The communication protocol implemented by the CPI circuit 100 does not define how the 10-bit value is used to route a packet from a source component to a destination component.

This routing is to be defined by the system 50. One approach for using the 10-bits is to break the 10-bit value into a 4-bit vertical ID, a 4-bit horizontal ID, and a 2-bit endpoint ID. A mesh fabric could use the vertical and horizontal IDs to reach a destination mesh switch point, and the endpoint ID could be used to specify one of four endpoints at the destination mesh switch. A second approach could use a hub and spoke switching approach to provide the connectivity to the multiple EP circuitry 70.

The transaction layer is responsible for reliable communication from a source EP circuitry 70 to a destination EP circuitry 70 through the switching fabric, such as communication network 55. The communication protocol implemented by the CPI circuit 100 has defined a flit that consists of a header 250 component and a payload 255 component. Each of the two components has its own error correction (ECC) field to allow detection and correction of header bit errors as the packet travels through the communication network 55 fabric queuing. The two flit components are referred to as the header and payload.

The parallel data and control packet 200 and serial data and control packet 300 flit header information is used to make routing decisions as a packet traverses the communication network 55. As such, the header information can be checked for corruption prior to being used at each fabric switch point of the communication network 55. The header has been made comparatively small to allow quick header ECC calculation. The parallel data and control packet 200 and serial data and control packet 300 payload information is used to transport protocol information from fabric source EP circuitry 70 to destination EP circuitry 70. The payload ECC calculation only needs to be performed at the destination EP circuitry 70, as mentioned above.

The link layer defines the mechanisms to allow reliable communication across a communication link 75. The number of wires for this communication link 75 used by the CPI circuit 100 is derived from the minimum necessary to efficiently communicate an 8-byte read and its data as a single cycle request and single cycle response. These signals are therefore used to define a flit. Packets requiring larger data sizes and more complex functionality (coherency, atomics, etc.) are then built from multiple consecutive flits transmitted over the communication link 75.

Link layer initialization includes determining the link configuration (width and frequency of link) for the serial protocol interface 350, training the communication link 75, and transitioning the communication link 75 to the active state, typically under the control of the controller 360 of the CPI circuit 100.

The CPI circuit 100 is expected to be used for a wide variety of applications, each requiring different tradeoffs between interface bandwidth, latency and energy consumption. To support these wide-ranging sets of requirements, the CPI circuit 100 supports multiple link widths and clocking rates. During initialization of the communication link 75, each CPI circuit 100 on each side of the serial protocol interface 350 will transmit the set of link width and clocking rates that are supported, typically under the control of the controller 360 of the CPI circuit 100. A commonly supported link width and clocking rate will be determined or negotiated by the controllers 360 first and second interconnected CPI circuits 100, or by other components couple to the controller 360, such as a processor 110.

Table 7 shows the serial protocol interface 350 clock rate options in a representative embodiment, and Table 8 shows the supported serial protocol interface 350 width options, also in a representative embodiment. It should be noted that it is expected that a CPI circuit 100 may not support all serial protocol interface 350 width and clock rate options depending on the needs and capabilities of the chiplet 60.

TABLE 7

| Data Transfer Rate | Clock Signal Rate |
|---|---|
| 16 GT/s | 4 Ghz |
| 4 GT/s | 1 Ghz |
| 1 GT/s | 0.25 Ghz |

As shown in Table 8, the communication protocol implemented by the CPI circuit 100 supports four performance modes that are determined during initialization, typically under the control of the controller 360 of the CPI circuit 100. These modes are determined by the number of data lanes used. The bandwidth column shows the expected bandwidth across a link pair assuming 100% read requests. 100% write streams would only sustain one half of the read bandwidth since the address and write data are both contained within a two flit request packet.

TABLE 8

| Mode | Data Lanes | Cycles for Full flit | ns/flit at 16 GT/sec | Read Bandwidth GB/sec |
|---|---|---|---|---|
| Full | 14 | 8 | 0.5 | 16 |
| Half | 7 | 16 | 1.0 | 8 |
| Quarter | 4 | 28 | 1.75 | 4.6 |
| Single Lane | 1 | 112 | 7.0 | 1.1 |

Link layer initialization includes the following activities, typically under the control of the controller 360 of the CPI circuit 100: negotiation of link width and data rate; link configuration for the communication link 75; link training for the communication link 75; and entering the active state for the communication link 75.

Link width and data rate negotiation occurs using bit zero of the communication link 75 interface data bus, with a data target transfer rate of 1 GT/s. A negotiation protocol is used by the controllers 360 to share supported link configurations and negotiate the target configuration. It should be noted that the receive and transmit side of the serial protocol interface 350 are required to have the same configuration. This requirement ensures that virtual channel credits can be returned at the same rate they are consumed.

Once link negotiation and configuration is complete, the chosen width and rate are used to configure the communication link 75. Thereafter link training can occur. Link training is the process of sending training data patterns to the receiving side of the link, so that the receiver can adjust where the received data is sampled. The known training data patterns allow the receiving side to validate that training has completed successfully. The training pattern sent across the communication link 75 includes information indicating that training has completed for one side of the link. When both sides are indicating successful training, the link can transition to the active state.

The ability to deactivate and later reactivate a link can be beneficial to minimize consumed energy. A link dedicated to a chiplet 60 that is needed for short intervals of time (I/O bursts or specialized computation capabilities) may be deactivated while the link is unused.

The approach taken to provide this capability is to use a handshake across the communication link 75 boundary through which each side indicates its readiness for the link to change state (active to inactive, or inactive to active), typically under the control of the controller 360 of the CPI circuit 100. Once both sides of the serial protocol interface 350 have indicated readiness to change, both sides transition to the new state. The flit header of the parallel data and control packet 200 and the serial data and control packet 300 has a link state bit (field 225) which is used to indicate that the serial protocol interface 350 (communication link 75) active/inactive state can be changed. The link state header bit (in field 225) of the communication protocol implemented using the controller 360 of the CPI circuit 100 can be controlled by a processor 110 (e.g., a software driver) or by a hardware state machine 365, for example and without limitation, as shown in FIG. 6.

As illustrated in FIG. 6, a processor 110 has control of the link state bit (field 225) on one side of the serial protocol interface 350, and a hardware state machine 365 controls the link state bit (field 225) on the other side of the serial protocol interface 350. The communication link 75 is brought up in the active state at reset to allow system EP circuitry 70 discovery.

Figure 11:
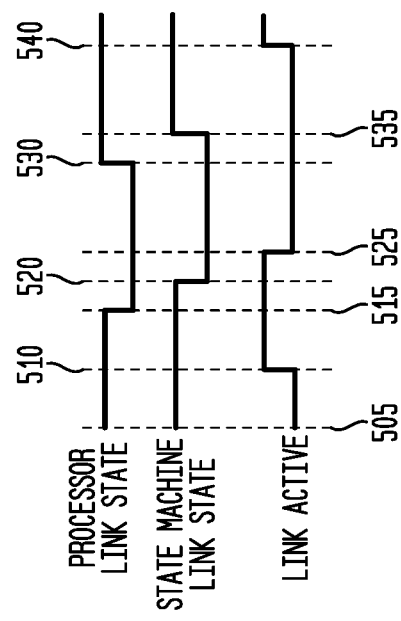
FIG. 11 is a timing diagram of a representative communication link activation for a computing system embodiment.

FIG. 11 is a timing diagram of a representative communication link activation for a computing system embodiment, and shows a timeline of the link state bit (field 225) and active transitions of the communication link 75 (and/or more generally the serial protocol interface 350) using the representative system 50C. At time marker 505, the system 50C is powered on with reset asserted, and the communication link 75 (and/or the serial protocol interface 350) enters configuration and initialization. The communication link 75 (and/or the serial protocol interface 350) is initialized as active to allow network EP circuitry 70 discovery.

At time marker 510, the communication link 75 (and/or the serial protocol interface 350) transitions to an active state allowing reliable data transmission.

At time marker 515, the processor 110 decides to deactivate the communication link 75 (and/or the serial protocol interface 350) and sets the link state bit (field 225) to zero (for the serial data and control packets 300 transmitted by the CPI circuit 100A). The link state bit (field 225), on an active link, is transmitted over the communication link 75 in each flit header of the serial data and control packet 300.

At time marker 520, the hardware state machine 365 on the other side of the communication link 75 (and/or the serial protocol interface 350) observes the change in link state indicating a request to take the link inactive. The hardware state machine 365 for this example is a slave to the processor 110 and immediately sets the link state bit (field 225) in the headers (transmitted by the CPI circuit 100B) of the serial data and control packet 300 to zero.

At time marker 525, both CPI circuits 100A, 100B have observed the header link state bits (field 225) are zero and deactivated the communication link 75. At this point, the clocks are disabled. The link state bit (field 225) is now transmitted as a DC signal on bit zero of the communication link 75.

At time marker 530, the processor 110 decides to activate the link and sets the link state DC value (on bit zero of the communication link 75) to one. At time marker 535, the hardware state machine 365 on the other side of the communication link 75 observes the change in received link state, indicating a request to take the link active. The hardware state machine 365 immediately sets its link state DC value to one. At time marker 540, the communication link 75 reinitializes and trains prior to the communication link 75 (and/or the serial protocol interface 350) going active. Once the communication link 75 is initialized, it becomes active and reliable data transmission can occur.

Link layer error correction is also implemented in representative embodiments. The CPI circuit 100 uses ECC to detect single and double bit errors and correct link single bit errors. Separate header ECC (HECC) and payload ECC (PECC) fields exist to allow hop-by-hop correction for header fields needed for routing a packet, and end-to-end correction for the packet payload. ECC was chosen over link level retry due to the low bit error rate for the target physical layer and to minimize link layer overhead.

Link layer virtual channels and credit based backpressure are also implemented in representative embodiments. The link layer of the communication protocol implemented by the CPI circuit 100 supports independent virtual channels to enable multiple logical packet streams across a single physical link. This is primarily to prevent deadlock between request and response packets without system wide pre-allocated resources at the protocol level. The communication protocol implemented by the CPI circuit 100 defines eight virtual channels, for example. During the link layer initialization sequence, the communication link 75 will pass credits per virtual channel to enable data to flow. The amount of buffering per virtual channel should be determined based on round trip packet/credit latency and maximum required bandwidth per virtual channel. The virtual channel assignments are as follows (detailed in Table 9): Virtual channels 0 and 1 are reserved for general priority request/response channels for memory access. It is expected that most traffic will be within channels 0 & 1. Virtual channels 2 and 3 are reserved for high priority request/response channels for memory access. Channels 2 and 3 should be used sparingly such that applications that need real time response can count on lower latency by using these channels. Virtual channels 4 and 5 are reserved for a vendor defined coherency protocol. The CIPI protocol layer does not define a coherency protocol, but it is expected some chiplet devices will implement a protocol to maintain cache consistency. Virtual channels 6 and 7 are reserved for future use.

TABLE 9

| Virtual Channel | Usage |
| --- | --- |
| 0 | General Priority Request |
| 1 | General Priority Response |
| 2 | High Priority Request |
| 3 | High Priority Response |
| 4 | Reserved for vendor defined coherency |
| 5 | Reserved for vendor defined coherency |
| 6 | Reserved for future use |
| 7 | Reserved for future use |

Figure 12:
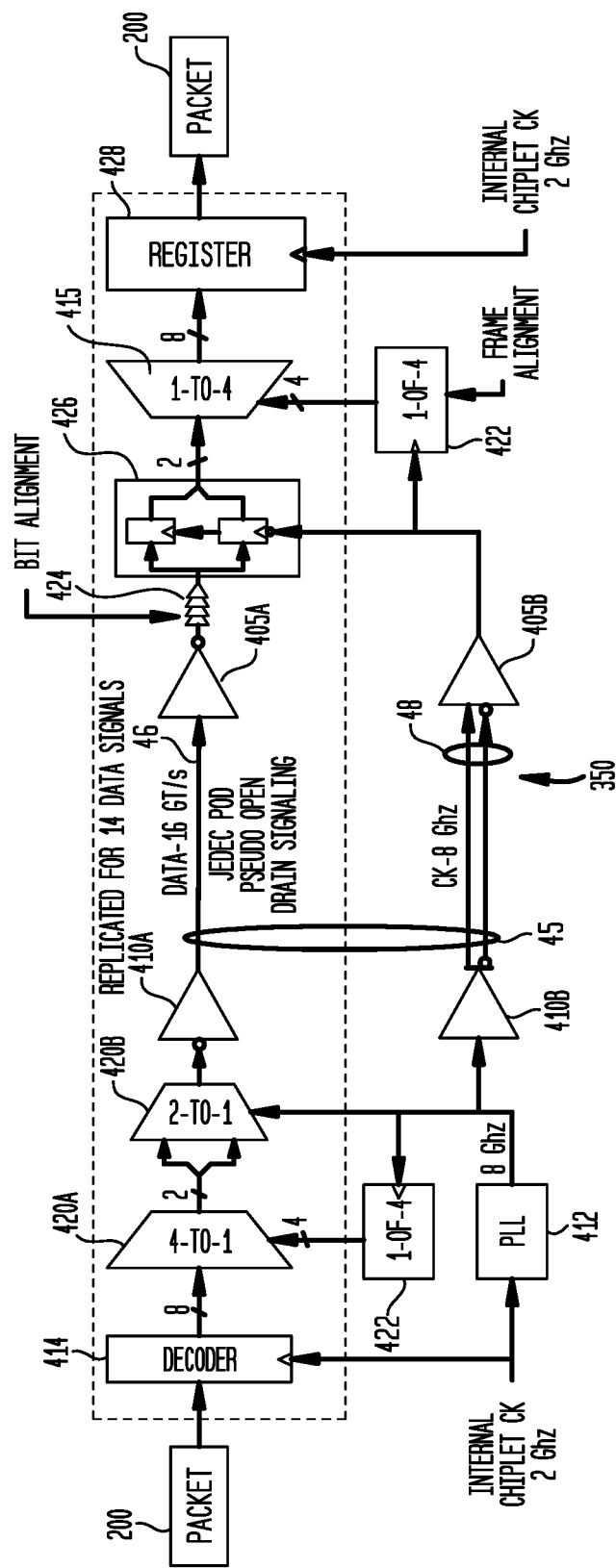
FIG. 12 is a block and circuit diagram of representative data and clock transmission and reception components of a representative CPI circuit apparatus embodiment for physical layer implementation.

The physical layer defines the transmission and reception of a raw bit stream across a physical medium. FIG. 12 is a block and circuit diagram of the data and clock transmission and reception components of a representative CPI circuit 100 apparatus embodiment for physical layer implementation, illustrating two interconnected CPI circuits 100, CPI circuit 100A and CPI circuit 100B.

In a representative embodiment, the communication link 75 comprises communication lines 45 between interconnected CPI circuit 100A and CPI circuit 100B and implemented as two unidirectional data and clock busses, data bus 46 and clock bus 48, one arranged to transmit from the CPI circuit 100A for reception by the CPI circuit 100B, and the other arranged to transmit from the CPI circuit 100B for reception by the CPI circuit 100A, with each data line running at 16 GT/s with a double data rate and the clock lines transmitting an eight GHz clock signal. One set of unidirectional communication lines 45 is illustrated in FIG. 12 for data and clock transmission from CPI circuit 100A to CPI circuit 100B. Those having skill in the art will recognize that communication from CPI circuit 100B to CPI circuit 100A is implemented identically and arranged in the opposite direction. In a representative embodiment, 14 data lines are implemented in each direction, one for each bit in a flit of the serial data and control packet 300, and two differential clock lines are implemented, also in each direction. In a representative embodiment, the electrical interface can be implemented using the JEDEC pseudo open drain 1.35 volt (POD135) standard, and may include improvements to the standard to reduce energy consumption, discussed below, taking advantage of the short traces between chiplets on a common substrate, including use of an organic substrate.

A single differential clock is sent (using clock transmitter 410B, implemented as a differential buffer circuit) with the data (using transmitter 410A, implemented as a buffer, for each data line) to generate the two clock edges to recover the data on the receiving side of the communication link 75. Corresponding receivers 405A (for data) and 405B are also implemented using buffer circuits. The serial protocol interface 350 is considered to be mesochronous. Both sides of the serial protocol interface 350 (i.e., both chiplets), use clocks derived from the same clock source so that although the phase relationship of the clocks is unknown, there will be no long-term clock drift. Because of this, the link level flow control credits are all that is needed to avoid buffer overflow conditions. In a representative embodiment, the clock source is 2 GHz, and converted to an 8 GHz clock signal using phase lock loop (PLL) 412.

A parallel data and control packet 200 is received from a parallel flit interface 425 and input into a decoder 414 and a series of multiplexers 420A, 420B, controlled by counter 422, with the multiplexers 420A, 420B and counter 422 clocked at the increased clock rate from the PLL 412. The multiplexers 420A, 420B select the various bits of the parallel data and control packet 200 to generate the sequence of 14 bit flits 305, 310, 315, 320, 325, 330, 335, and 340 of the serial data and control packet 300 for transmission by the transmitter 410A.

At the receiving side, a variable delay block 424 and a data sampling block 426 are implemented, and adjusted during training to center the received data signal for sampling with the corresponding clock edge. As the flits of the serial data and control packet 300 are received, they are reassembled into a corresponding, received parallel data and control packet 200 using demultiplexer 415 and stored in register 428, for output to a parallel flit interface 425 at the lower clock rate.

The initialization and training sequences for the communication link 75 are used to align each input data signal to the associated input clock. The transmitting side of the serial protocol interface 350 sends a training pattern for the receivers 405 to establish proper alignment. Once data bit alignment is complete then the flit framing is established. When the receive side of the serial protocol interface 350 is properly trained, the transmit side of the same serial protocol interface 350 can send an alternate training pattern indicating training complete to the other side of the link. Once both sides are sending the training complete pattern, both sides can transition to a trained state and start sending properly formatted flits. The training process is controlled by the controller 360 within the CPI circuit 100.

A significant amount of a device's power is usually in the I/O interfaces and anything that can be done to reduce I/O power is beneficial. The serial protocol interface 350 physical layer provides two means to minimize I/O power. First, the CPI circuit 100 uses a Pseudo Open Drain implementation such that an output driven to a one state uses minimal power. The data driven through the output driver (transmitter 410A) is inverted with the assumption that a flit will naturally have more zero values than ones, and is transmitted as ones, reducing power consumption. As such, an idle flit should be defined to contain as many zero values as possible.

The second power reduction mechanism is the use of link deactivation for communication links 75 that will be idle for long periods of time. Link deactivation (described above) provides the means to shutdown clocks of the serial protocol interface 350, include the transmit side PLL 412. Link reactivation requires a short training period to allow the interface receive side to reestablish beginning of flit alignment.

It should be noted that alternative physical layers could be defined that leverage the upper layers (protocol, transaction and link). One example would be an external interface that is the full width of a flit transferring data at the chiplet 60 internal rate. This alternate physical layer would greatly increase the number of interface signals but would simplify the CPI circuit 100 by removing the multiplexers 420A, 420B and demultiplexer 415.

Figure 13:
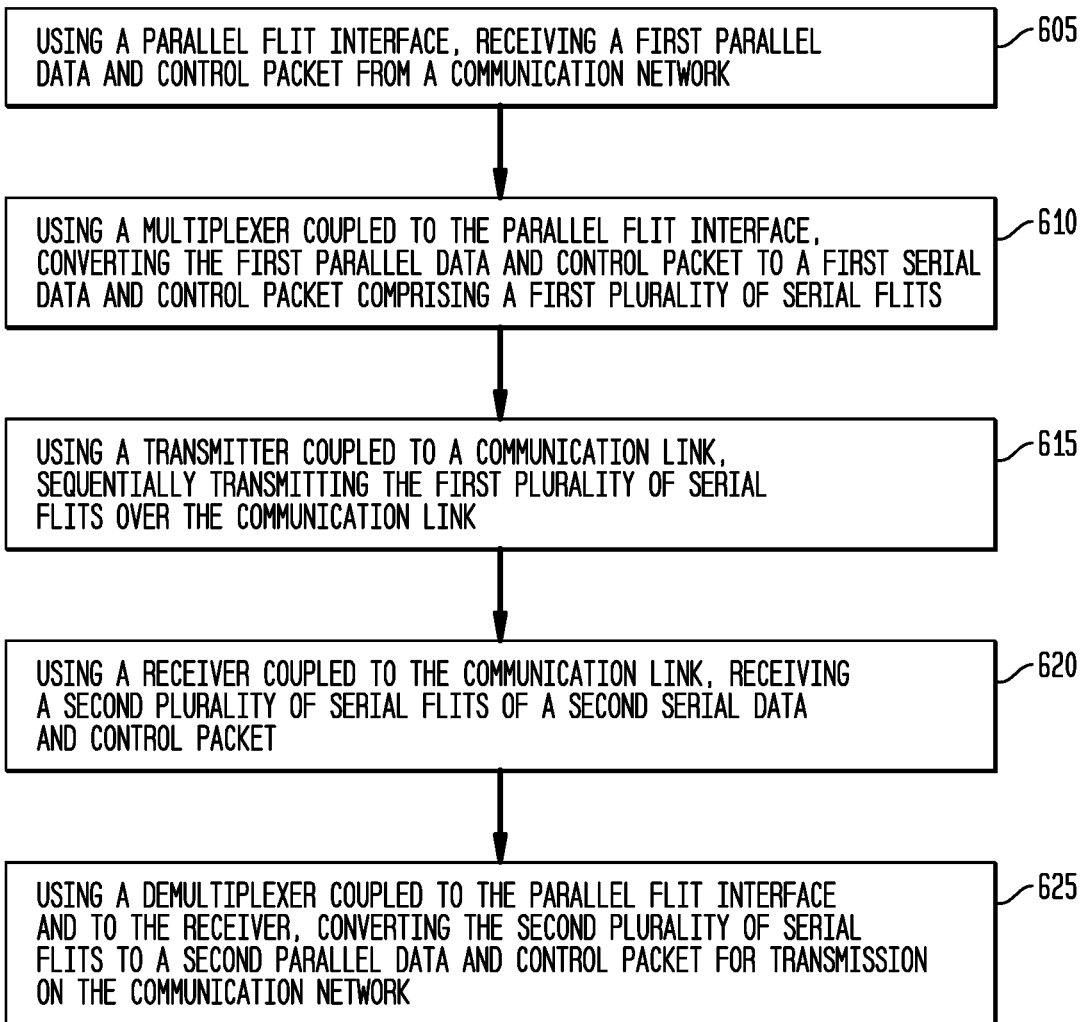
FIG. 13 is a flow chart of a method of data communication on a communication link coupling a first integrated circuit to a second integrated circuit arranged on an interposer.

FIG. 13 is a flow chart of a method 600 of data communication on a communication link coupling a first integrated circuit to a second integrated circuit arranged on an interposer. The method 600 comprises: using a parallel flit interface, receiving a first parallel data and control packet from a communication network, step 605; using a multiplexer coupled to the parallel flit interface, converting the first parallel data and control packet to a first serial data and control packet comprising a first plurality of serial flits, step 610; using a transmitter coupled to a communication link, sequentially transmitting the first plurality of serial flits over the communication link, step 615; using a receiver coupled to the communication link, receiving a second plurality of serial flits of a second serial data and control packet, step 620; and using a demultiplexer coupled to the parallel flit interface and to the receiver, converting the second plurality of serial flits to a second parallel data and control packet for transmission on the communication network, step 625.

As used herein, a "processor" 110 or controller 360 may be any type of processor or controller, and may be embodied as one or more processors or controllers configured, designed, programmed or otherwise adapted to perform the functionality discussed herein. As the term processor or controller is used herein, a processor 110 or controller 360 may include use of a single integrated circuit ("IC"), or may include use of a plurality of integrated circuits or other components connected, arranged or grouped together, such as controllers, microprocessors, digital signal processors ("DSPs"), array processors, graphics or image processors, parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor or controller should be understood to equivalently mean and include a single IC, or arrangement of custom ICs, ASICs, processors, microprocessors, controllers, FPGAs, adaptive computing ICs, or some other grouping of integrated circuits which perform the functions discussed herein, with associated memory, such as microprocessor memory or additional RAM, DRAM, SDRAM, SRAM, MRAM, ROM, FLASH, EPROM or EPROM. A processor 110 or controller 360, with associated memory, may be adapted or configured (via programming, FPGA interconnection, or hard-wiring) to perform the methodology of the invention, as discussed herein. For example, the methodology may be programmed and stored, in a processor 110 or controller 360 with its associated memory (and/or memory 120) and other equivalent components, as a set of program instructions or other code (or equivalent configuration or other program) for subsequent execution when the processor 110 or controller 360 is operative (i.e., powered on and functioning). Equivalently, when the processor 110 or controller 360 may implemented in whole or part as FPGAs, custom ICs and/or ASICs, the FPGAs, custom ICs or ASICs also may be designed, configured and/or hard-wired to implement the methodology of the invention. For example, the processor 110 or controller 360 may be implemented as an arrangement of analog and/or digital circuits, controllers, microprocessors, DSPs and/or ASICs, collectively referred to as a "processor" or "controller", which are respectively hard-wired, programmed, designed, adapted or configured to implement the methodology of the invention, including possibly in conjunction with a memory 120.

The memory circuit 120, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 110 or controller 360), whether volatile or non-volatile, whether removable or non-removable, including without limitation RAM, FLASH, DRAM, SDRAM, SRAM, MRAM, FeRAM, ROM, EPROM or EPROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory circuit 120 may be adapted to store various look up tables, parameters, coefficients, other information and data, programs or instructions (of the software of the present invention), and other types of tables such as database tables.

As indicated above, the processor 110 or controller 360 is hard-wired or programmed, using software and data structures of the invention, for example, to perform the methodology of the present invention. As a consequence, the system and related methods of the present invention, including the various instructions, may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, Matlab, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 110, 110A, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the memory 125, e.g., a floppy disk, a CDROM, a CD-RW, a DVD, a magnetic hard drive, an optical drive, or any other type of data storage apparatus or medium, as mentioned above.

A memory controller 115 may be implemented as known or becomes known in the art. The network interface (I/O) circuits, including Gen-Z and CCIX chiplets, may be implemented as known or may become known in the art, and may include impedance matching capability, voltage rectification circuitry, voltage translation for a low voltage processor to interface with a higher voltage control bus for example, various switching mechanisms (e.g., transistors) to turn various lines or connectors on or off in response to signaling from a processor, other control logic circuitry, and/or physical coupling mechanisms. In addition, the network interface (I/O) circuits are also adapted to receive and/or transmit signals externally to the system, such as through hard-wiring or RF signaling, for example, to receive and transmit information in real-time, also for example. The network interface (I/O) circuits also may be stand-alone devices (e.g., modular). The network interface (I/O) circuits are utilized for appropriate connection to a relevant channel, network or bus; for example, the network interface (I/O) circuits may provide impedance matching, drivers and other functions for a wireline interface, may provide demodulation and analog to digital conversion for a wireless interface, and may provide a physical interface for the memory with other devices. In general, the network interface (I/O) circuits are used to receive and transmit data, depending upon the selected embodiment.

Additional communication interfaces may also be utilized for appropriate connection to a relevant channel, network or bus, to provide data communication between the system 50 and any type of network or external device, such as wireless, optical, or wireline, and using any applicable standard (e.g., one of the various Industry Standard Architecture (ISA) bus, Enhanced ISA (EISA) bus, Micro Channel Architecture (MCA) bus, Peripheral Component Interconnect (PCI) bus, SAN bus, or any other communication or signaling medium, such as Ethernet, ISDN, T1, satellite, wireless, PCI, USB, RJ 45, Ethernet (Fast Ethernet, Gigabit Ethernet, 300ase-TX, 300ase-FX, etc.), IEEE 802.11, Bluetooth, WCDMA, WiFi, GSM, GPRS, EDGE, 3G and the other standards and systems, for example and without limitation), and may include impedance matching capability, voltage translation for a low voltage processor to interface with a higher voltage control bus, wireline or wireless transceivers, and various switching mechanisms (e.g., transistors) to turn various lines or connectors on or off in response to signaling from processor 110 or controller 360.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. In addition, every intervening sub-range within range is contemplated, in any combination, and is within the scope of the disclosure. For example, for the range of 5-10, the sub-ranges 5-6, 5-7, 5-8, 5-9, 6-7, 6-8, 6-9, 6-10, 7-8, 7-9, 7-10, 8-9, 8-10, and 9-10 are contemplated and within the scope of the disclosed range.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

With respect to signals, we refer herein to parameters that "represent" a given metric or are "representative" of a given metric, where a metric is a measure of a state of at least part of the regulator or its inputs or outputs. A parameter is considered to represent a metric if it is related to the metric directly enough that regulating the parameter will satisfactorily regulate the metric. A parameter may be considered to be an acceptable representation of a metric if it represents a multiple or fraction of the metric.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A system comprising:
   an interposer;
   a first integrated circuit arranged on the interposer, the first integrated circuit comprising a first common protocol interface circuit;
   a communication link coupled to the first common protocol interface circuit; and
   a second integrated circuit arranged on the interposer, the second integrated circuit comprising a second common protocol interface circuit coupled to the communication link to form a serial protocol interface between the first common protocol interface circuit and the second common protocol interface circuit.

2. The system of claim 1, wherein:
   the first integrated circuit further comprises:
      a first processor;
      a first memory controller;
      a first communication network coupled to the first common protocol interface circuit, to the first memory controller, and to the first processor;
   and
   the second integrated circuit further comprises:
      a second processor;
      a second memory controller;
      a second communication network coupled to the second common protocol interface circuit, to the second memory controller, and to the second processor;
   wherein the first communication network, the first common protocol interface circuit, the second common protocol interface circuit, and the second communication network collectively define a singular, addressable data and control communication network.

3. The system of claim 1, wherein the first common protocol interface circuit comprises:
   a first parallel flit interface to receive a first parallel data and control packet from the first communication network;
   a first multiplexer coupled to the first parallel flit interface to convert the first parallel data and control packet to a first serial data and control packet comprising a first plurality of serial flits;
   a first transmitter coupled to the communication link to sequentially transmit the first plurality of serial flits over the communication link to the second common protocol interface circuit;
   a first receiver coupled to the communication link to receive a second plurality of serial flits of a second serial data and control packet from the second common protocol interface circuit; and
   a first demultiplexer coupled to the first parallel flit interface and to the first receiver to convert the second plurality of serial flits to a second parallel data and control packet for transmission on the first communication network.

4. The system of claim 3, wherein the second common protocol interface circuit comprises:
   a second parallel flit interface to receive a third parallel data and control packet from the second communication network;
   a second multiplexer coupled to the second parallel flit interface to convert the third parallel data and control packet to a third serial data and control packet comprising a third plurality of serial flits;
   a second transmitter coupled to the communication link to sequentially transmit the third plurality of serial flits over the communication link to the first common protocol interface circuit;
   a second receiver coupled to the communication link to receive a fourth plurality of serial flits of a fourth serial data and control packet from the first common protocol interface circuit; and
   a second demultiplexer coupled to the second parallel flit interface and to the second receiver to convert the fourth plurality of serial flits to a fourth parallel data and control packet for transmission on the second communication network.

5. The system of claim 3, wherein the first and second parallel data and control packets each comprise a single flit having an ordered plurality of fields, each field of the ordered plurality of fields comprising one or more bits, the first and second parallel data and control packets each further comprising:
- a packet header comprising: a first field of the ordered plurality of fields specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field, the fourth field specifying a virtual channel; a fifth field of the ordered plurality of fields next to the fourth field, the fifth field specifying a link state; a sixth field of the ordered plurality of fields next to the fifth field, the sixth field specifying a packet length in flits; and a seventh field of the ordered plurality of fields next to the sixth field, the seventh field specifying a destination component identification; and
- a payload comprising: an eighth field of the ordered plurality of fields next to the seventh field, the eighth field specifying a payload error correction code; and a ninth field of the ordered plurality of fields next to the eighth field, the ninth field specifying a data payload.

6. The system of claim 3, wherein the first and second serial data and control packets each comprise a respective first or second sequence of a plurality of flits, each flit of the first or second sequence of the plurality of flits having one or more fields of an ordered plurality of fields, each field of the ordered plurality of fields comprising one or more bits, the first and second serial data and control packets each further comprising:
- a packet header comprising:
- a first flit of the plurality of flits, the first flit comprising: a first field of the ordered plurality of fields, the first field specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field the fourth field specifying a virtual channel; and a fifth field of the ordered plurality of fields next to the fourth field, the fifth field specifying a link state; and
- a second flit, of the plurality of flits, following the first flit and comprising: a sixth field of the ordered plurality of fields, the sixth field specifying a packet length in flits; and a seventh field of the ordered plurality of fields next to the sixth field, the seventh field specifying a destination component identification; and
- a payload comprising:
- a third flit, of the plurality of flits, following the second flit and comprising: an eighth field of the ordered plurality of fields, the eighth field specifying a payload error correction code; and a first part of a ninth field of the ordered plurality of fields next to the eighth field, the first part of the ninth field specifying a data payload;
- a fourth flit, of the plurality of flits, following the third flit and comprising: a second part of the ninth field specifying the data payload;
- a fifth flit, of the plurality of flits, following the fourth flit and comprising: a third part of the ninth field specifying the data payload;
- a sixth flit, of the plurality of flits, following the fifth flit and comprising: a fourth part of the ninth field specifying the data payload;
- a seventh flit, of the plurality of flits, following the sixth flit and comprising: a fifth part of the ninth field specifying the data payload; and
- an eighth flit, of the plurality of flits, following the seventh flit and comprising: a sixth part of the ninth field specifying the data payload.

7. The system of claim 1, wherein the serial protocol interface comprises a plurality of layers, the plurality of layers comprising a protocol layer comprising a plurality of packet commands, the plurality of packet commands comprising:
- a probe;
- a read8, a read16, or a read 64;
- a read configuration space;
- a read response;
- a write8, a write16, or a write64;
- a write configuration;
- a write response;
- an atomic; and
- an interrupt.

8. The system of claim 7, wherein a read operation comprises a first serial data and control packet transmission having a memory address and a request size, and a second serial data and control packet transmission having requested memory read data.

9. The system of claim 7, wherein a write operation comprises a first serial data and control packet transmission having a memory address, data, a data mask, and a request size, and a second serial data and control packet transmission having a write completion and status.

10. The system of claim 1, wherein the serial protocol interface comprises a plurality of layers, the plurality of layers comprising a transaction layer comprising endpoint addressing and routing and error correction.

11. The system of claim 1, wherein the serial protocol interface comprises a plurality of layers, the plurality of layers comprising a link layer implementing a single cycle request and a single cycle response.

12. The system of claim 11, wherein the link layer is initialized to determine a communication link configuration for both width and frequency or clocking rate, communication link training, and transitioning the communication link to an active state; wherein the link layer uses error correction coding for detection of single and double bit errors and correction of single bit errors; wherein the link layer implements a plurality of virtual channels; and wherein the link layer provides a plurality of credits per virtual channel to enable data to flow.

13. The system of claim 12, wherein the communication link may be transitioned between an active state and an inactive state for control of energy consumption.

14. The system of claim 1, wherein the serial protocol interface comprises a plurality of layers, the plurality of layers comprising a physical layer providing a unidirectional receive path and a unidirectional transmission path.

15. A common protocol interface circuit comprising:
- a parallel flit interface to receive a first parallel data and control packet from a communication network;
- a multiplexer coupled to the parallel flit interface to convert the first parallel data and control packet to a first serial data and control packet comprising a first plurality of serial flits;
- a transmitter coupled to a communication link to sequentially transmit the first plurality of serial flits over the communication link;

a receiver coupled to the communication link to receive a second plurality of serial flits of a second serial data and control packet; and a demultiplexer coupled to the parallel flit interface and to the receiver to convert the second plurality of serial flits to a second parallel data and control packet for transmission on the communication network.

16. The circuit of claim 15, wherein the first and second parallel data and control packets each comprise a single flit having an ordered plurality of fields, each field of the ordered plurality of fields comprising one or more bits, the first and second parallel data and control packets each further comprising:

a packet header comprising: a first field of the ordered plurality of fields, the first field specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field, the fourth field specifying a virtual channel; a fifth field of the ordered plurality of fields next to the fourth field, the fifth field specifying a link state; a sixth field of the ordered plurality of fields next to the fifth field, the sixth field specifying a packet length in flits; and a seventh field of the ordered plurality of fields next to the sixth field, the seventh field specifying a destination component identification; and a payload comprising: an eighth field of the ordered plurality of fields next to the seventh field, the eighth field specifying a payload error correction code; and a ninth field of the ordered plurality of fields next to the eighth field, the ninth field specifying a data payload.

17. The circuit of claim 15, wherein the first and second serial data and control packets each comprise a respective first or second sequence of a plurality of flits, each flit of the first or second sequence of the plurality of flits having one or more fields of an ordered plurality of fields, each field of the ordered plurality of fields comprising one or more bits, the first and second serial data and control packets each further comprising:

a packet header comprising:

a first flit of the plurality of flits, the first flit comprising: a first field of the ordered plurality of fields, the first field specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field, the fourth field specifying a virtual channel; a fifth field of the ordered plurality of fields next to the fourth field, the fifth field specifying a link state; and a second flit, of the plurality of flits, following the first flit and comprising: a sixth field of the ordered plurality of fields, the sixth field specifying a packet length in flits; and a seventh field of the ordered plurality of fields next to the sixth field, the seventh field specifying a destination component identification; and a payload comprising:

a third flit, of the plurality of flits, following the second flit and comprising: an eighth field of the ordered plurality of fields, the eighth field specifying a payload error correction code; and a first part of a ninth field of the ordered plurality of fields next to the eighth field, and the first part of the ninth field specifying a data payload;

a fourth flit, of the plurality of flits, following the third flit and comprising: a second part of the ninth field specifying the data payload;

a fifth flit, of the plurality of flits, following the fourth flit and comprising: a third part of the ninth field specifying the data payload;

a sixth flit, of the plurality of flits, following the fifth flit and comprising: a fourth part of the ninth field specifying the data payload;

a seventh flit, of the plurality of flits, following the sixth flit and comprising: a fifth part of the ninth field specifying the data payload; and an eighth flit, of the plurality of flits, following the seventh flit and comprising: a sixth part of the ninth field specifying the data payload.

18. A method of data communication on a communication link coupling a first integrated circuit to a second integrated circuit arranged on an interposer, the method comprising:

using a parallel flit interface, receiving a first parallel data and control packet from a communication network;

using a multiplexer coupled to the parallel flit interface, converting the first parallel data and control packet to a first serial data and control packet comprising a first plurality of serial flits;

using a transmitter coupled to a communication link, sequentially transmitting the first plurality of serial flits over the communication link;

using a receiver coupled to the communication link, receiving a second plurality of serial flits of a second serial data and control packet; and using a demultiplexer coupled to the parallel flit interface and to the receiver, converting the second plurality of serial flits to a second parallel data and control packet for transmission on the communication network.

19. The method of claim 18, wherein the first and second parallel data and control packets each comprise a single flit having an ordered plurality of fields, each field of the ordered plurality of fields comprising one or more bits, the first and second parallel data and control packets each further comprising:

a packet header comprising: a first field of the ordered plurality of fields specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field, the fourth field specifying a virtual channel; a fifth field of the ordered plurality of fields next to the fourth field, the fifth field specifying a link state; a sixth field of the ordered plurality of fields next to the fifth field, the sixth field specifying a packet length in flits; and a seventh field of the ordered plurality of fields next to the sixth field, the seventh field specifying a destination component identification; and a payload comprising: an eighth field of the ordered plurality of fields next to the seventh field, the eighth field specifying a payload error correction code; and a ninth field of the ordered plurality of fields next to the eighth field, the ninth field specifying a data payload.

20. The method of claim 18, wherein the first and second serial data and control packets each comprise a respective first or second sequence of a plurality of flits, each flit of the first or second sequence of the plurality of flits having one or more fields of an ordered plurality of fields, each field of the ordered plurality of fields comprising one or more bits, the first and second serial data and control packets each further comprising:

a packet header comprising:
a first flit of the plurality of flits, the first flit comprising: a first field of the ordered plurality of fields, the first field specifying a header error correction code; a second field of the ordered plurality of fields next to the first field, the second field specifying a credit return virtual channel; a third field of the ordered plurality of fields next to the second field, the third field specifying a credit return ready; a fourth field of the ordered plurality of fields next to the third field, the fourth field specifying a virtual channel; a fifth field of the ordered plurality of fields next to the fourth field, the fifth field specifying a link state; and
a second flit, of the plurality of flits, following the first flit and comprising: a sixth field of the ordered plurality of fields, the sixth field specifying a packet length in flits; and a seventh field of the ordered plurality of fields next to the sixth field, the seventh field specifying a destination component identification; and a payload comprising:
a third flit, of the plurality of flits, following the second flit and comprising: an eighth field of the ordered plurality of fields, the eighth field specifying a payload error correction code; and a first part of a ninth field of the ordered plurality of fields next to the eighth field, the first part of the ninth field specifying a data payload;
a fourth flit, of the plurality of flits, following the third flit and comprising: a second part of the ninth field specifying the data payload;
a fifth flit, of the plurality of flits, following the fourth flit and comprising: a third part of the ninth field specifying the data payload;
a sixth flit, of the plurality of flits, following the fifth flit and comprising: a fourth part of the ninth field specifying the data payload;
a seventh flit, of the plurality of flits, following the sixth flit and comprising: a fifth part of the ninth field specifying the data payload; and
an eighth flit, of the plurality of flits, following the seventh flit and comprising: a sixth part of the ninth field specifying the data payload.

\* \* \* \* \*